(12) United States Patent
Komatsu et al.

(10) Patent No.: US 7,351,654 B2
(45) Date of Patent: Apr. 1, 2008

(54) SEMICONDUCTOR DEVICE AND METHOD FOR PRODUCING THE SAME

(75) Inventors: Norishiro Komatsu, Tokyo (JP); Fumiki Aiso, Tokyo (JP); Toshiyuki Hirota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 328 days.

(21) Appl. No.: 11/132,258

(22) Filed: May 19, 2005

(65) Prior Publication Data

US 2005/0260862 A1    Nov. 24, 2005

(30) Foreign Application Priority Data

May 19, 2004   (JP)   .............................. 2004-149647

(51) Int. Cl.
*H01L 21/4763*   (2006.01)

(52) U.S. Cl. ................................ 438/647; 257/E21.297

(58) Field of Classification Search ................ 438/647; 257/E21.297

See application file for complete search history.

(56) References Cited

U.S. PATENT DOCUMENTS

| 6,046,083 A * | 4/2000 | Lin et al. ..................... 438/255 |
| 2002/0028542 A1* | 3/2002 | Bevk .......................... 438/153 |

FOREIGN PATENT DOCUMENTS

| JP | 63-292617 | 11/1988 |
| JP | H03-070123 | 3/1991 |
| JP | H04-065122 | 3/1992 |
| JP | H05-109617 | 4/1993 |
| JP | H11-297852 | 10/1999 |
| KR | 1999-72788 | 9/1999 |
| KR | 2000-48361 | 7/2000 |

* cited by examiner

*Primary Examiner*—Bradley K Smith
(74) *Attorney, Agent, or Firm*—Young & Thompson (57) ABSTRACT

A method for producing a semiconductor device includes the steps of forming silicon crystal nuclei on a substrate, depositing first amorphous silicon, depositing second amorphous silicon, and crystallizing the first amorphous silicon and the second amorphous silicon by allowing the crystal nuclei to grow in the solid phase.

20 Claims, 9 Drawing Sheets

FIG. 3    SILICON CRYSTAL NUCLEI

SEMICONDUCTOR DEVICE AND METHOD FOR PRODUCING THE SAME

This application claims priority to prior Japanese patent application JP 2004-149647, the disclosure of which is incorporated herein by reference.

BACKGROUND OF THE INVENTION

1. Field of the Invention

The present invention relates to semiconductor devices and methods for producing the devices, and particularly relates to a semiconductor device having a contact plug including a polysilicon, and a method for producing the device.

2. Description of the Related Art

Finer semiconductor devices with higher packing density have increasingly been developed in recent years, For example, dynamic random access memory (DRAM) with a high capacity, namely 1 Gbit, has been put into practical use.

Each memory cell in DRAM is basically composed of a gate transistor and a capacitor. One of the diffusion layers included in the gate transistor is connected to a bit line while the other diffusion layer is connected to an electrode of the capacitor.

According to known methods, such components in semiconductor devices are connected with contact plugs formed by filling contact holes with conductive materials. Japanese Unexamined Patent Application Publication No. 2001-024170 discloses a polysilicon contact plug. Japanese Unexamined Patent Application Publication No. 9-074188 discloses a polysilicon plug structure including a heavily doped upper polysilicon layer and a lightly doped lower polysilicon layer. This structure is aimed at inhibiting the diffusion of impurities from the plug portion into diffusion layers of a silicon substrate to suppress junction leakage current in the diffusion layer regions.

The reduction of wiring resistance is becoming essential with the increasing demand for finer semiconductor integrated circuits. In the above DRAM memory cell structure, particularly, polysilicon contact plugs are used to connect one diffusion region of the gate transistor to the bit line and to connect the other diffusion region to the capacitor. A significant subject here is to reduce the contact resistance of the contact plugs.

Sufficiently low contact resistance could previously be attained using polysilicon contact plugs by heat treatment at high temperatures for a long time. Recent devices, however, are difficult to anneal at high temperatures for a long time because the devices require shallow junctions and inhibited impurity diffusion to achieve the transistor performance of the peripheral circuitry.

For example, the annealing of devices with a design rule of 0.11 μm in a furnace is performed at 850° C. or less only for about several minutes. Rapid thermal annealing (RTA) allows heat treatment at higher temperatures, namely 900° C. or more, but only for about tens of seconds.

The resistance of the above wiring is the series resistance of the contact interfaces (interface resistance) and the contact plugs. Two effects can be provided by conventional heat treatment with high heat load at high temperatures for a long time, One is the effect of aggregating oxide films occurring naturally at the interfaces with the substrate into balls to reduce the contact resistance at the interfaces. The other is the effect of allowing the contact plugs to grow larger crystal grains which have fewer crystal grain boundaries. This results in the reduction of the resistance in the plugs.

As described above, however, such heat treatment involving high heat load has become difficult to perform, and the wiring resistance must be reduced under low heat load conditions. The resistance of the contact interfaces was once considered to be the dominant resistance. Studies, however, show that the resistance of the contact interfaces can be reduced by keeping the surface of the semiconductor substrate at the bottom of the contact holes sufficiently clean. The surface of the substrate may be kept clean by, for example, removing etching-damaged layers, such as SiC, formed during the formation of the contact holes, or by controlling the atmosphere in a low-pressure chemical vapor deposition (LP-CVD) apparatus during the introduction of the substrate into the apparatus (reducing the contents of oxygen and moisture to several ppm).

On the other hand, an initial possible approach to reducing the resistance of the contact plugs is solid-phase epitaxial growth at the bottoms of the contact holes on the substrate by depositing and annealing amorphous silicon. This approach, however, cannot meet the low heat load requirements because stable solid-phase epitaxial growth requires hydrogen baking at high temperatures, namely 900° C. or more, for about ten minutes in the same reaction chamber before the deposition of amorphous silicon.

Another possible approach is to increase the concentration of the impurities in the plugs. The resistance decreases with increasing impurity concentration up to a predetermined concentration. Above the predetermined concentration, on the contrary, the resistance increases because the impurities segregate at the crystal grain boundaries. Thus the concentration at which the plug resistance is minimized makes it difficult to further reduce the resistance simply by increasing the concentration.

In addition, an excessively high impurity concentration disadvantageously increases junction leakage current because the impurities in the contact plugs diffuse to the substrate, as shown in Japanese Unexamined Patent Application Publication No. 9-74188. To avoid the problem, according to this publication, the impurity concentration is decreased at the bottom portions of the contact plugs to inhibit the diffusion of the impurities into the substrate.

When, however, this technique is applied to finer contact plugs, the resistance of the plugs by themselves increases. This technique therefore has difficulty in providing low contact resistance in spite of inhibited junction leakage current.

SUMMARY OF THE INVENTION

A subject of the present invention according to findings for solving the above problems by the present inventors is to provide a method for producing a low-resistance contact plug disposed in a contact hole and low-resistance wiring, and also to provide a semiconductor device produced by the method.

The present invention provides a method for producing a semiconductor device. This method includes the steps of forming silicon crystal nuclei on a substrate, depositing first amorphous silicon, depositing second amorphous silicon, and crystallizing the first amorphous silicon and the second amorphous silicon by allowing the crystal nuclei to grow in the solid phase.

The present invention further provides a semiconductor device produced by the above method.

According to the above method for producing a semiconductor device, after the crystal nuclei are formed, a lightly doped lower amorphous silicon layer and a heavily doped upper amorphous silicon layer may be deposited and heat-treated to form large silicon crystal grains.

The resultant polysilicon contact plug wiring includes large crystal grains and therefore includes fewer crystal grain boundaries per unit volume to reduce electrical resistance. Such low-resistance wiring allows the achievement of a finer semiconductor device with higher packing density and performance and a method for producing the device.

DESCRIPTION OF THE PREFERRED EMBODIMENTS

Semiconductor devices and methods for producing the devices will now be described with reference to the drawings.

First Embodiment

A first embodiment of the present invention is described below. FIGS. 1 to 5 are sectional views showing the main process flow of a method for producing a semiconductor device according to this embodiment.

Figure 1:
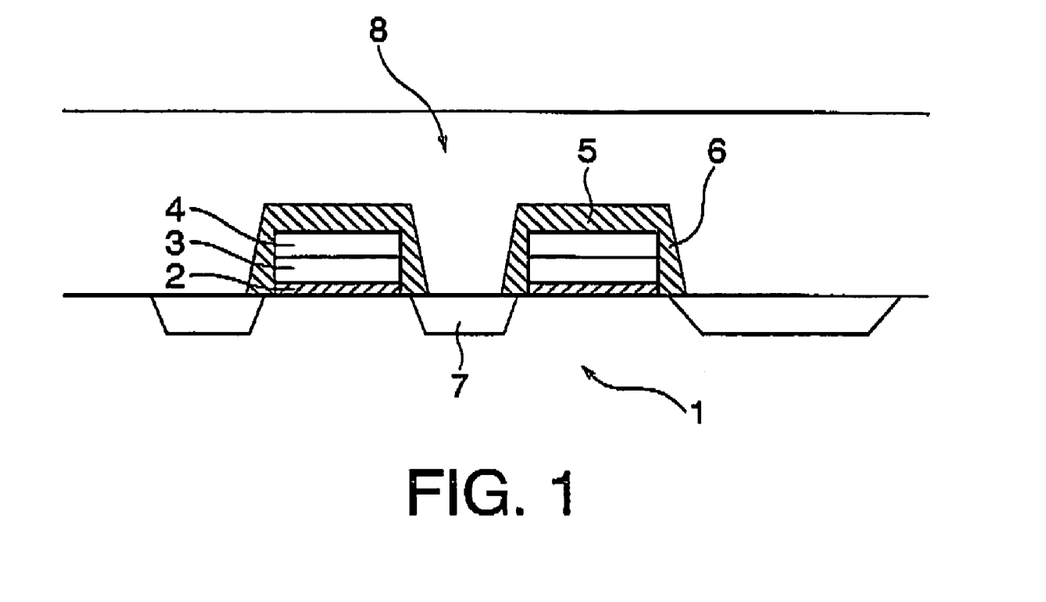
FIGS. 1 to 5 are sectional views showing the process flow of a method for producing a semiconductor device according to a first embodiment of the present invention.

Referring to FIG. 1, a gate insulating film 2, a polysilicon film 3, a metal silicide film 4, and a mask insulating film 5 are deposited on a semiconductor substrate 1, and a gate electrode is formed by lithography and etching. Subsequently, a sidewall insulating film 6 is deposited, and diffusion layer regions 7 are formed. These components are covered with an interlayer film 8.

Figure 2:
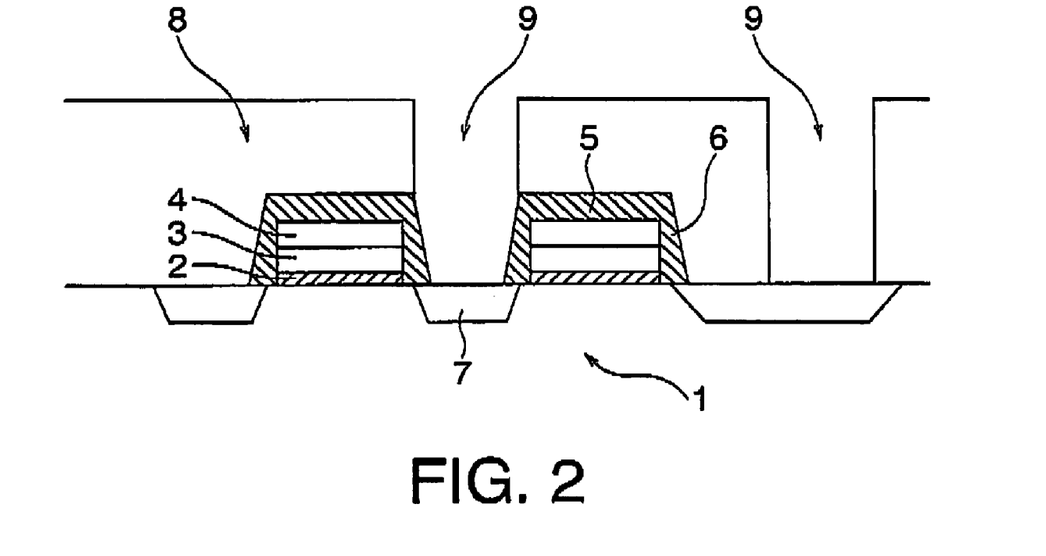

Contact holes 9 reaching the diffusion layer regions 7 are formed (in FIG. 2). These contact holes 9 are covered with a lightly doped lower amorphous silicon layer 10 having a phosphorus concentration of $1 \times 10^{20}$ atoms/cm$^3$ and a thickness of 3 to 30 nm and a heavily doped upper amorphous silicon layer 11 having a phosphorus concentration of $2 \times 10^{20}$ to $6 \times 10^{20}$ atoms/cm$^3$ and a thickness of 100 nm or more (in FIG. 3).

Figure 3:
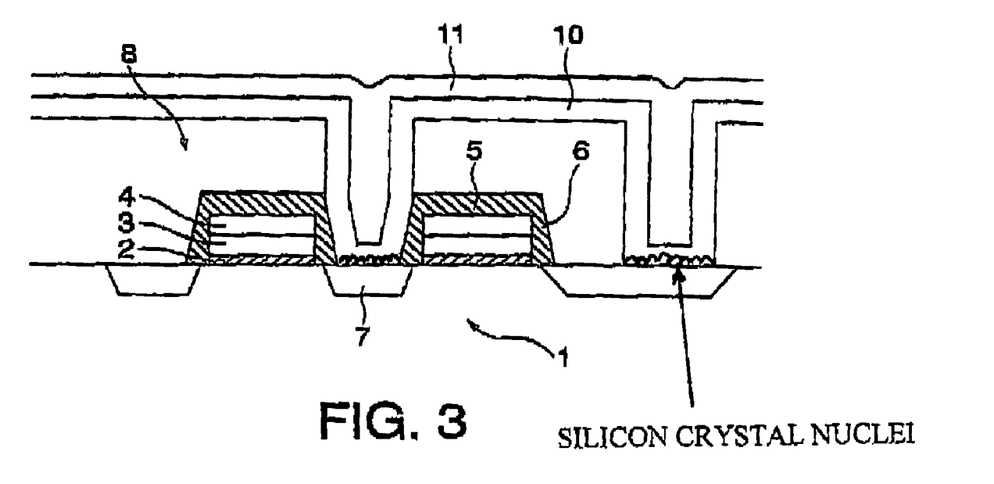

These amorphous silicon layers 10 and 11 are allowed to grow on a wafer placed in a reactor by low-pressure chemical vapor deposition (LP-CVD). Silicon crystal nuclei having a diameter of about 2 nm are formed on the wafer at 520° C. to 540° C. (preferably, 530° C.) and 5 to 40 Pa (preferably, 25 Pa) for 30 to 120 seconds (preferably, 60 seconds) by supplying monosilane gas at 1,800 to 2,000 cc/min. In the deposition, relatively low pressure is important for isolating the growing silicon crystal nuclei at a certain density on the substrate 1. The gas used is not limited to monosilane gas, and may also be disilane gas.

The deposition pressure is then increased to 80 to 120 Pa (preferably, 90 Pa) with the wafer still placed in the reactor to grow a silicon film. In the deposition, relatively high pressure is important for depositing amorphous silicon.

In the deposition of amorphous silicon, doping with phosphorus is simultaneously performed by supplying PH$_3$ gas. The flow rate of PH$_3$ gas is first adjusted to 47 to 48 cc/min to form a desired amorphous silicon layer having a low phosphorus concentration ($1 \times 10^{20}$ atoms/cm$^3$). The flow rate is then adjusted to 180 to 190 cc/min to form a desired amorphous silicon layer having a high phosphorus concentration ($2 \times 10^{20}$ to $6 \times 10^{20}$ atoms/cm$^3$).

PH$_3$ gas is not supplied in the formation of the crystal nuclei in this embodiment, but may also be supplied in the formation of the crystal nuclei. In addition, the gas used is monosilane gas in this embodiment, but is not limited to monosilane gas and may also be disilane gas.

Figure 4:
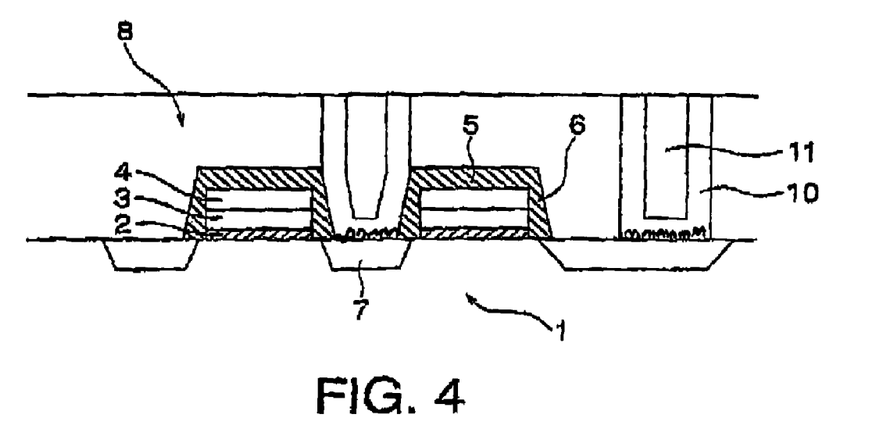
Figure 5:
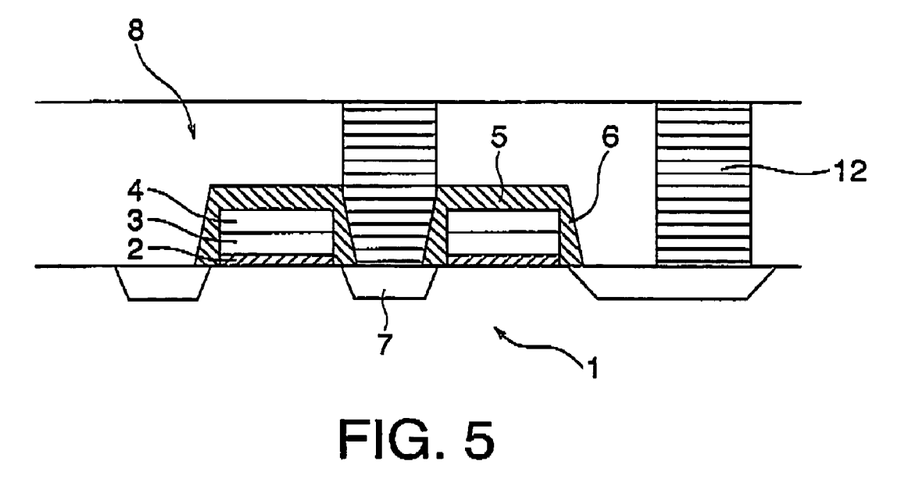

The amorphous silicon layers 10 and 11 are flattened by etch back or chemical mechanical polishing (CMP) to leave only plug portions (in FIG. 4). The amorphous silicon is crystallized by heat treatment in a nitrogen atmosphere at 700° C. to 850° C. so that the amorphous silicon is electrically activated to form polysilicon plugs 12 (in FIG. 5). The contact plugs thus produced have satisfactorily low contact resistance.

Formation of the crystal nuclei is aimed at providing sites for solid-phase growth of crystal grains. The crystal nuclei serve as seeds for crystallizing the lower amorphous silicon and the upper amorphous silicon in the solid-phase growth by the subsequent heat treatment.

In addition, the present inventors have found that the solid-phase growth rate of the crystals in the amorphous silicon varies according to differences in impurity concentration, and a higher impurity concentration provides faster solid-phase growth.

Furthermore, the present inventors have found that this phenomenon may be used to reduce the apparent density of the crystal nuclei with a combination of a lightly doped lower amorphous silicon layer and a heavily doped upper amorphous silicon layer. A lower apparent density of crystal nuclei enables the individual crystal grains to grow to a larger size without interfering with each other.

If the heat treatment is performed without the formation of the crystal nuclei to crystallize the amorphous silicon, crystals start to grow at various sites in unison above a predetermined temperature. This process therefore has difficulty in controlling the density of the grains and allowing large grains to grow. The same problem also occurs if lightly doped amorphous silicon and heavily doped amorphous silicon are deposited without the formation of crystal nuclei. Thus the crystal nuclei not only provide sites for solid-phase growth, but also determine the positions of the sites. It should be noted that the effects of the present invention can be achieved only when crystal nuclei, a lightly doped amorphous silicon layer, and a heavily doped amorphous silicon layer are formed in that order and are heat-treated to grow crystals.

Figure 6:
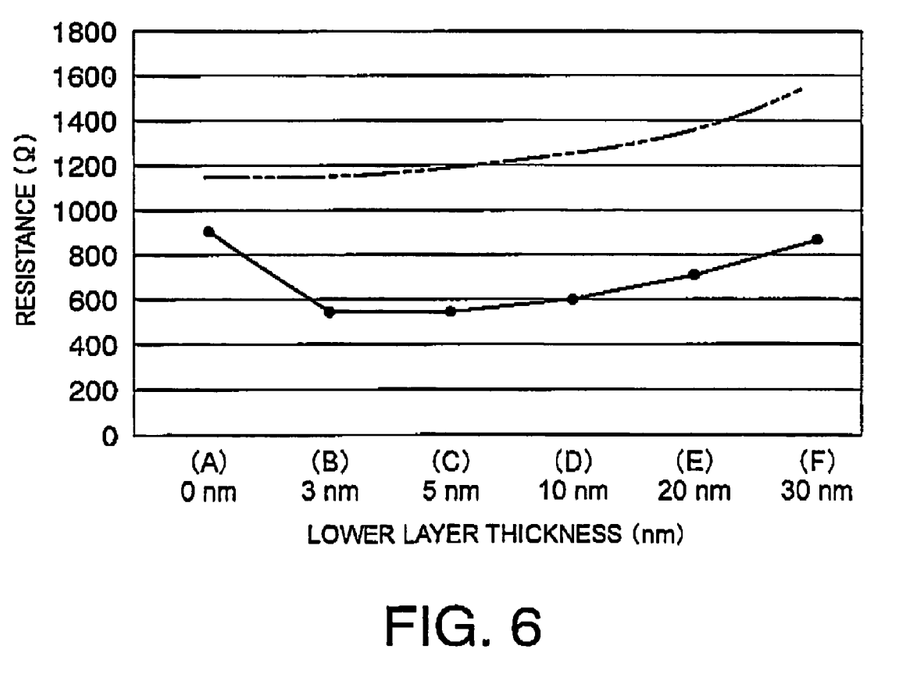
FIG. 6 is a graph showing the relationship between the thickness of an amorphous silicon layer and resistance.

To confirm the above findings, contact plugs including lightly doped lower amorphous silicon layers with varying thicknesses were formed in contact holes in which crystal nuclei were formed and in those in which no crystal nuclei were formed. The contact holes had a diameter of 90 nm. FIG. 6 shows the results with the crystal nuclei formed (solid line) and with no crystal nuclei formed (two-dot chain line).

The contact holes were filled with lightly doped lower amorphous silicon layers having an impurity concentration of $1 \times 10^{20}$ atoms/cm$^3$ and heavily doped upper amorphous silicon layers having an impurity concentration of $2\times10^{20}$ atoms/cm$^3$. The lower layers ranged in thickness from levels A to F. The amorphous silicon was heat-treated at 850° C. to form polysilicon plugs. The resistance of the plugs was measured to evaluate the relationship between the thickness of the lower layers and the resistance.

The lightly doped lower amorphous silicon layers had a thickness of 0 nm at level A, a thickness of 3 nm at level B, a thickness of 5 nm at level C, a thickness of 10 nm at level D, a thickness of 20 nm at level E, and a thickness of 30 nm at level F.

In FIG. 6, the solid line indicates the resistance with the crystal nuclei formed, and the two-dot chain line indicates the resistance with no crystal nuclei formed. The contact plugs with the crystal nuclei formed (indicated by the solid line) had a contact resistance of about 900 Ω at level A (the thickness of the lightly doped lower amorphous silicon layer: 0 nm), a contact resistance of about 550 Ω at level B (the thickness of the lightly doped lower amorphous silicon layer: 3 nm), a contact resistance of about 570 Ω at level C (the thickness of the lightly doped lower amorphous silicon layer: 5 nm), a contact resistance of about 600 Ω at level D (the thickness of the lightly doped lower amorphous silicon layer: 10 nm), a contact resistance of about 700 Ω at level E (the thickness of the lightly doped lower amorphous silicon layer: 20 nm), and a contact resistance of about 820 Ω at level F (the thickness of the lightly doped lower amorphous silicon layer: 30 nm).

On the other hand, the contact plugs with no crystal nuclei formed (indicated by the two-dot chain line) in the related art had contact resistances ranging from about 1,200 to 1,500 Ω. According to the results, the contact plugs with the crystal nuclei in the present invention had lower resistance than those with no crystal nuclei by 20% to 50%. In addition, the plug occupied entirely by the heavily doped amorphous silicon (at level A) exhibited the highest resistance among the plugs with the crystal nuclei in the embodiment by the present inventors, though the plug was expected to exhibit the lowest resistance because of high impurity concentration in the overall plug.

Furthermore, the resistance of the contact plugs increased with increasing thickness of the lightly doped lower layers probably because thicker lightly doped layers resulted in lower impurity concentrations in the limited volumes of the plugs. The contact plugs had impurity concentrations decreasing from level A to level F, though the plug having the highest impurity concentration at level A had the highest resistance.

Figure 7A:
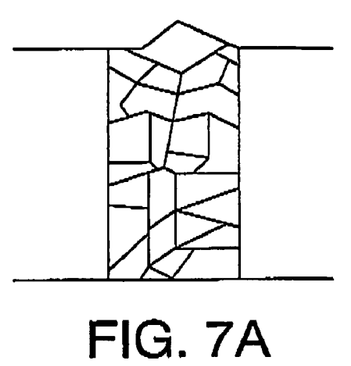
FIGS. 7A and 7B are schematic diagrams of crystal grain boundaries.
Figure 7B:
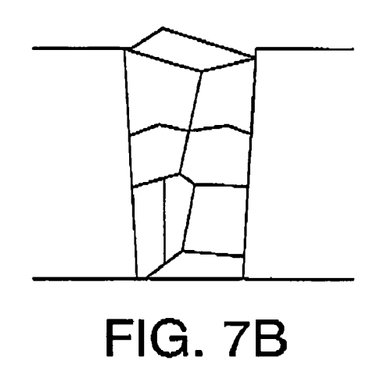

These results are discussed below. FIGS. 7A and 7B are schematic diagrams of scanning electron microscope (SEM) photographs of the resultant polysilicon plugs. These diagrams show that the plug including the lower amorphous silicon layer at any level (in FIG. 7B) grew larger crystal grains than the plug including only the heavily doped amorphous silicon layer (in FIG. 7A).

That is, after the formation of the crystal nuclei, the combination of the lightly doped lower amorphous silicon layer and the heavily doped upper amorphous silicon layer grew larger crystal grains than the heavily doped amorphous silicon layer alone in the crystallization by heat treatment. As a result, the density of the crystal grain boundaries decreases to allow more current to flow and improve the resistance.

Figure 8A:
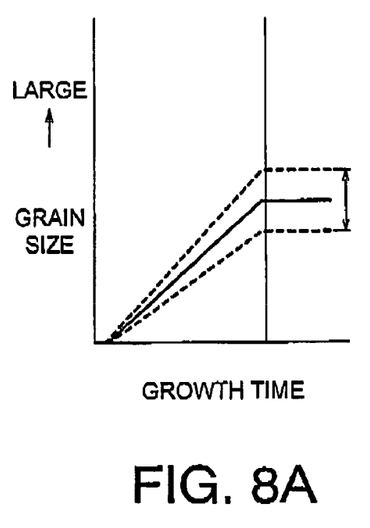
FIGS. 8A and 8B are graphs showing crystal growth.

This mechanism is described below with reference to FIGS. 8A and 8B. FIG. 8A is a graph for the heavily doped amorphous silicon layer alone while FIG. 8B is a graph for the combination of the lightly doped lower amorphous silicon layer and the heavily doped upper amorphous silicon layer.

In FIG. 8A, crystal grains grow from crystal nuclei at the beginning of crystallization by heat treatment until the contact holes are fully filled with the crystal grains. The crystal growth stops when the contact holes are fully filled. The group of crystal grains grows in the plug with a statistical distribution (variations) in growth rate and grain size. The heavily doped amorphous silicon grows its crystals fast on average, and thus the contact holes are fully filled quickly. Accordingly, relatively small crystal grains occupy most of the space in the contact holes though the grain size varies.

Figure 8B:
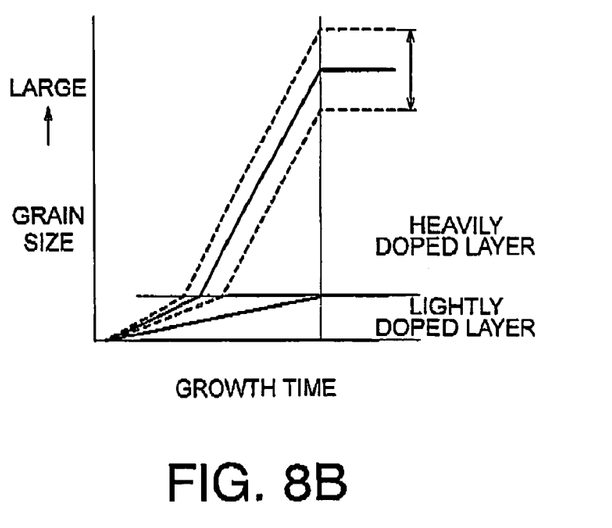

For the combination of the lower and upper amorphous silicon layers, in FIG. 8B, crystal grains start to grow from crystal nuclei in the lightly doped lower amorphous silicon layer at the beginning of crystallization by heat treatment. Some crystal grains crystallizing in the lightly doped amorphous silicon layer first reach the interface with the heavily doped amorphous silicon layer because the crystal growth rate has statistical variations. The lightly doped lower amorphous silicon layer crystallizes at a low rate, and therefore serves to expand temporal variations until the boundaries of the crystals growing in the solid phase reach the heavily doped layer.

The crystal grain boundaries reaching the heavily doped layer rise sharply in solid-phase growth rate to immediately crystallize the surrounding highly doped amorphous silicon, and successively crystallize the lightly doped amorphous silicon. The crystal grains that have reached the heavily doped amorphous silicon layer inhibit the growth of crystal grains lagging behind them. The inhibited crystal grains therefore remain small.

The heavily doped amorphous silicon continues to crystallize and grows large crystal grains at portions reached earlier by growing crystals. As a result, a minority of large crystal grains is formed and occupies most of the space of the contact holes. These large crystals facilitate electrical conduction to reduce the electrical resistance of the contact plugs.

Accordingly, the thicknesses and concentrations of the lightly doped lower amorphous silicon layer and the heavily doped upper amorphous silicon layer should be determined according to the size of the contact holes and whether priority is given to the reduction of the resistance or the inhibition of impurity diffusion from the plugs into the substrate.

If priority is given to the reduction of the resistance, the lightly doped lower layer may have a thickness of 3 to 5 nm. If the thickness is below 3 nm, the crystal grains instantly reach the heavily doped upper layer, and thus the desired effect cannot be achieved. If, on the other hand, priority is given to the inhibition of impurity diffusion into the substrate, the lightly doped lower layer may have a thickness of, for example, 20 to 30 nm for contact holes with a diameter of 90 nm. If the thickness is not less than 45 nm, the contact holes are fully filled only with the lightly doped layer. As a result, the resistance increases, and thus the desired effect cannot be achieved.

According to this embodiment, after the crystal nuclei are formed, the lightly doped lower amorphous silicon layer and the heavily doped upper amorphous silicon layer are deposited and allowed to grow their crystals by heat treatment. This method can produce large crystal grains to provide a contact plug with low contact resistance.

These process flows may be repeated two or more times to produce a contact plug structure having multilayer structure.

If amorphous silicon is allowed to grow after the formation of crystal nuclei, as in the present invention, the amorphous silicon may crystallize partially by thermal history in the deposition even before annealing. If the amorphous silicon having both crystal portions and amorphous portions is subjected to processing such as etch back and CMP, the crystal portions may be etched at an abnormally high rate. Such etching causes abnormal formation such as abnormal plug loss.

To relieve such problems, a three-layer structure may be provided by forming the lightly doped lower amorphous silicon layer (first layer) in the contact holes with a reduced thickness, forming the heavily doped upper amorphous silicon layer (second layer) in the contact holes with a reduced thickness, and forming a third lightly doped amorphous silicon layer on the second layer with a thickness equivalent to the amount of reduction in the thickness of the first layer and second layer. This third amorphous silicon layer preferably has an impurity concentration of $1 \times 10^{19}$ to $1 \times 10^{20}$ atoms/cm$^3$, and is preferably deposited by LP-CVD together with the first and second amorphous silicon layers.

Even if crystals grow before annealing, their growth can be retarded at the third lightly doped amorphous silicon layer to keep the growing crystals in the vicinity of the second heavily doped layer. The third layer can therefore inhibit abnormal formation in the processing. The third layer, however, is not particularly required if the overall amorphous silicon is annealed and crystallized before the processing such as etch back and CMP.

Second Embodiment

A second embodiment of the present invention will now be described. The main process flow of a method for producing a semiconductor device according to this embodiment is described below with reference to FIGS. 9 to 15. The same components as in the first embodiment are indicated by the same reference numerals.

Figure 9:
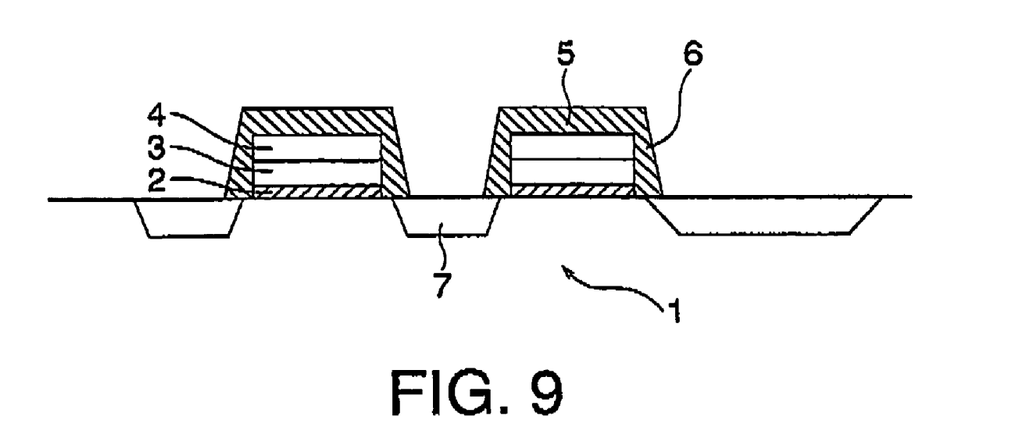
FIGS. 9 to 15 are sectional views showing the process flow of a method for producing a semiconductor device according to a second embodiment of the present invention.
Figure 10:
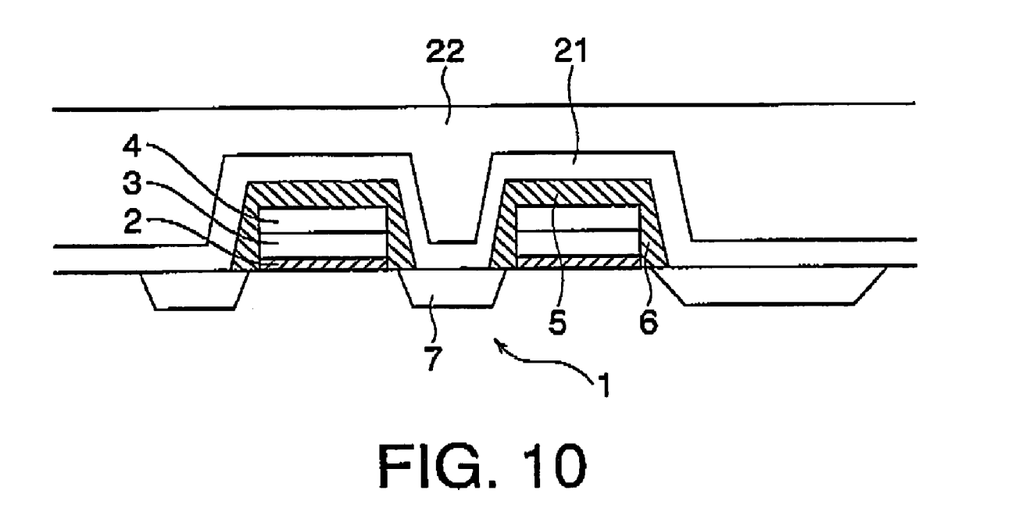
Figure 11:
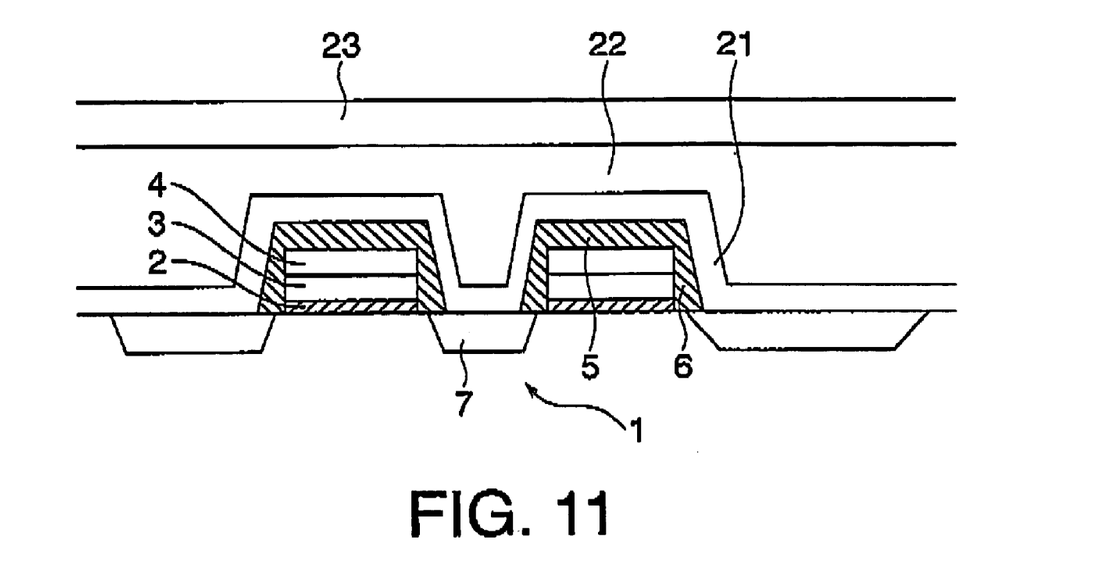

Referring to FIG. 9, a gate insulating film 2, a polysilicon film 3, a metal silicide film 4, and a mask insulating film 5 are deposited on a semiconductor substrate 1, and a gate electrode is formed by lithography and etching. Subsequently, a sidewall insulating film 6 is deposited, and diffusion layer regions 7 are formed. Referring to FIG. 10, these components are covered with a lightly doped lower amorphous silicon layer 21 having a phosphorus concentration of $1 \times 10^{20}$ atoms/cm$^3$ and a thickness of 3 to 30 nm and a heavily doped upper amorphous silicon layer 22 having a phosphorus concentration of $2 \times 10^{20}$ to $6 \times 10^{20}$ atoms/cm$^3$ and a thickness of 100 nm or more.

These amorphous silicon layers 21 and 22 are allowed to grow on a wafer placed in a reactor by LP-CVD. Silicon crystal nuclei having a size of about 2 nm are formed on the wafer at 520° C. to 540° C. and 5 to 40 Pa (preferably, 25 Pa) for 30 to 120 seconds (preferably, 60 seconds) by supplying monosilane gas at 1,800 to 2,000 cc/min. In the deposition, relatively low pressure is important for isolating the growing silicon crystal nuclei at a certain density on the substrate 1.

The deposition pressure is then increased to 80 to 120 Pa (preferably, 90 Pa) with the wafer still placed in the reactor to grow a silicon film. Increasing the deposition pressure is important for depositing amorphous silicon.

In the deposition of amorphous silicon, doping with phosphorus is simultaneously performed by supplying PH$_3$ gas. The flow rate of PH$_3$ gas is first adjusted to 47 to 48 cc/min to form a desired amorphous silicon layer having a low phosphorus concentration ($1 \times 10^{20}$ atoms/cm$^3$). The flow rate is then adjusted to 180 to 190 cc/min to form a desired amorphous silicon layer having a high phosphorus concentration ($2 \times 10^{20}$ to $6 \times 10^{20}$ atoms/cm$^3$).

PH$_3$ gas is not supplied in the formation of the crystal nuclei in this embodiment, but may also be supplied in the formation of the crystal nuclei. In addition, the gas used is monosilane gas in this embodiment, but is not limited to monosilane gas and may also be disilane gas.

Figure 12:
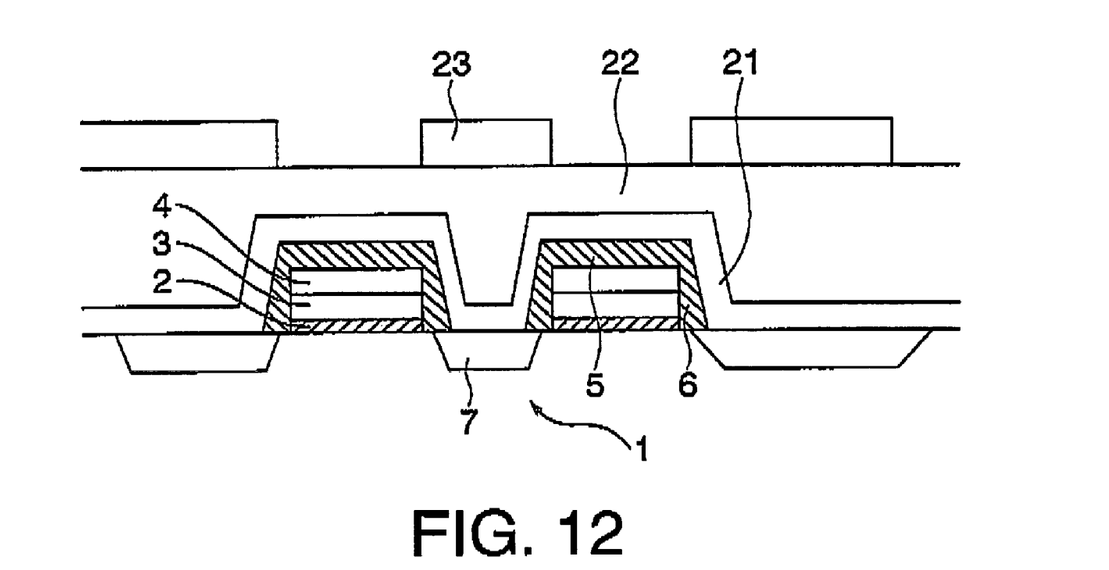
Figure 13:
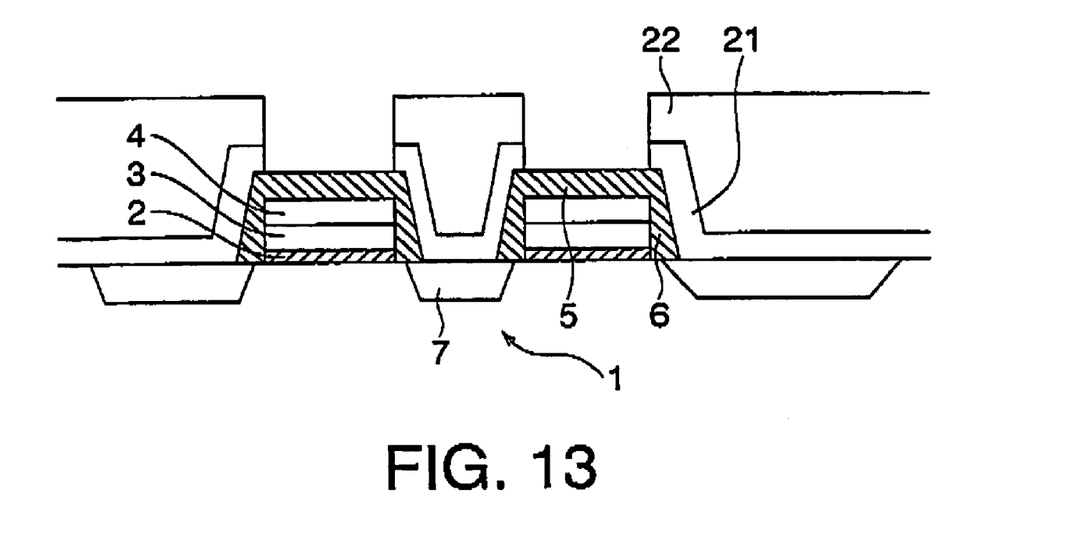
Figure 14:
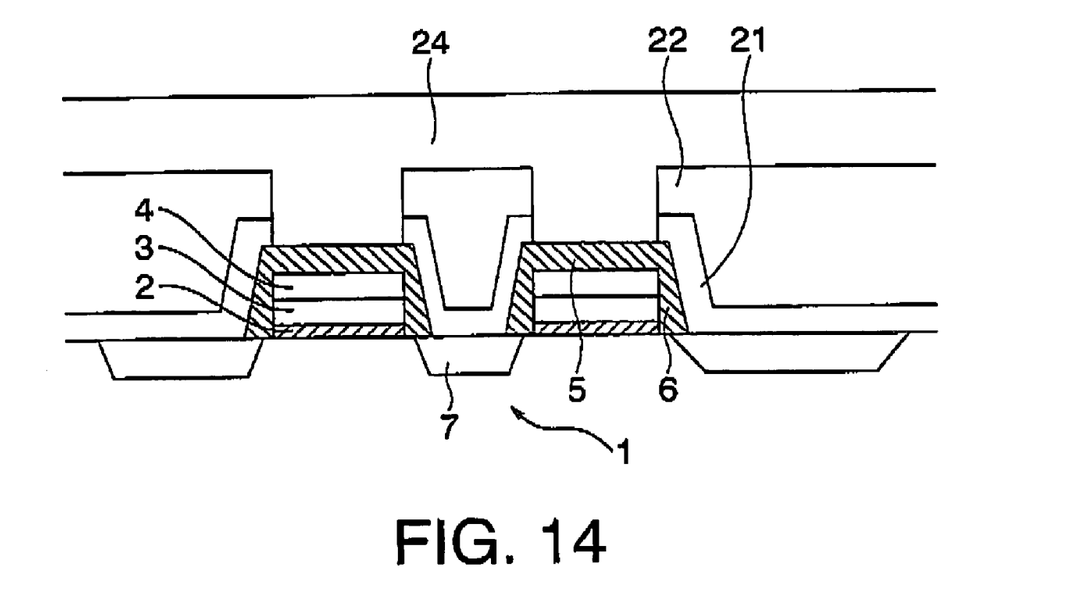
Figure 15:
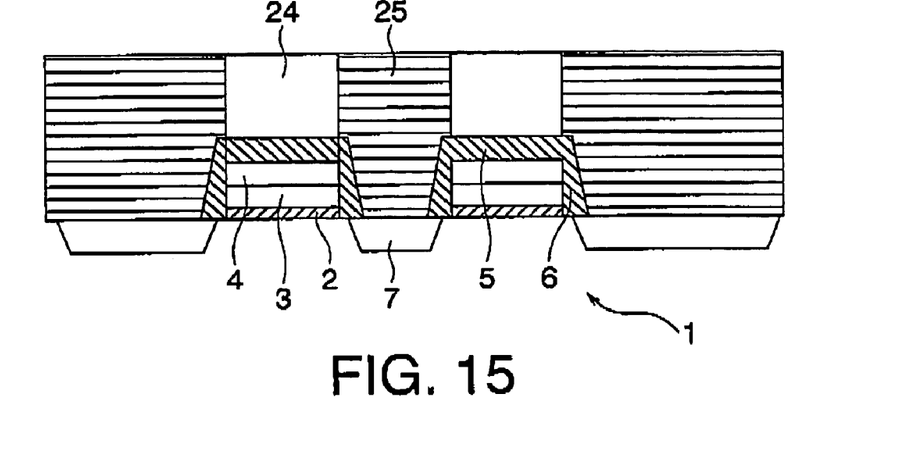

Subsequently, a mask insulating film 23 is deposited (FIG. 11), and is processed by applying a resist, lithography, and etching to leave the film 23 only on contact plug portions (FIG. 12). The portions of the amorphous silicon layers 21 and 22 above gate insulating film 2 are then etched using the remaining mask insulating film 23 as a mask to leave the plug portions (in FIG. 13), and an interlayer insulating film 24 is deposited (in FIG. 14).

The interlayer insulating film 24 is flattened by etch back or CMP to expose the top surface of the heavily doped amorphous silicon layer 22. The amorphous silicon is crystallized by heat treatment in a nitrogen atmosphere at 700° C. to 850° C. so that the amorphous silicon is electrically activated to form polysilicon plugs 25 (in FIG. 15). The contact plug wiring thus produced has satisfactorily low contact resistance.

The mask used is the mask insulating film 23 in this embodiment, but is not limited to insulating films and may also be a resist mask. In addition, a three-layer structure may be provided by forming the lightly doped amorphous silicon layer 21 (first layer), forming the heavily doped amorphous silicon layer 22 (second layer), and forming a third amorphous silicon layer doped more lightly than the second layer on the second layer.

According to this embodiment, after the crystal nuclei are formed, the lightly doped lower amorphous silicon layer 21 and the heavily doped upper amorphous silicon layer 22 are deposited and allowed to grow their crystals by heat treatment. This method can produce large crystal grains to provide a contact plug with low contact resistance.

Third Embodiment

Figure 17:
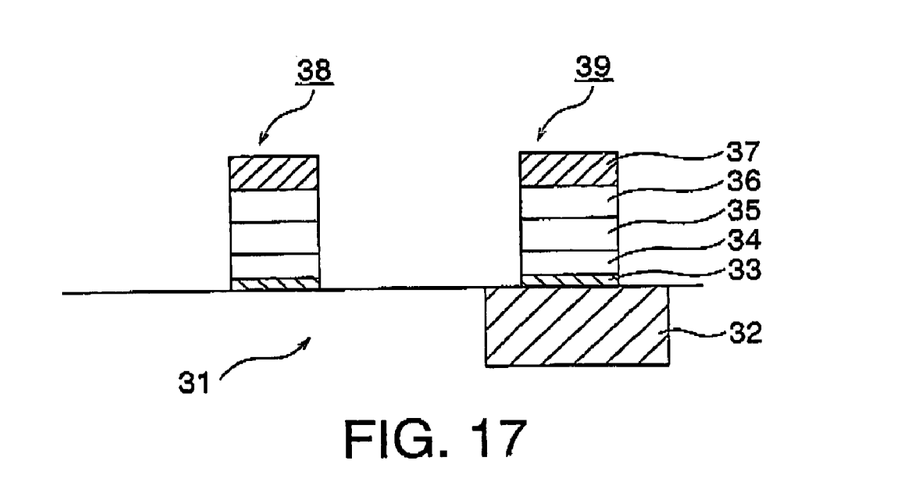
Figure 18:
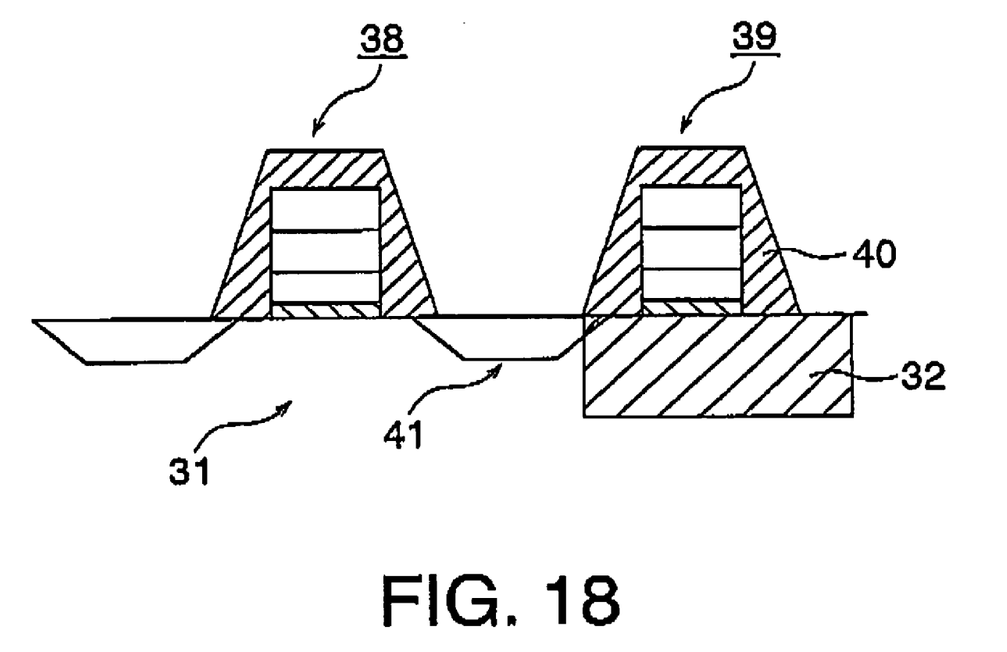

A third embodiment of the present invention will now be described with reference to FIGS. 16 to 18. In the third embodiment, the methods according to the above embodiments are applied to the production of a gate electrode and wiring.

Figure 16:
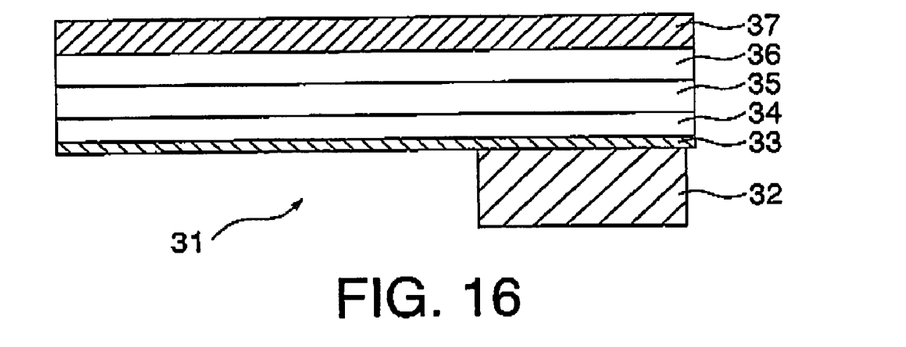
FIGS. 16 to 18 are sectional views showing the process flow of a method for producing a semiconductor device according to a third embodiment of the present invention.

Referring to FIG. 16, a gate insulating film 33, a lightly doped amorphous silicon layer 34, a heavily doped amorphous silicon layer 35, a metal silicide film 36, and a mask insulating film 37 are deposited on a semiconductor substrate 31 having an insulating isolation region 32.

The lightly doped amorphous silicon layer 34 has a phosphorus concentration of $1 \times 10^{20}$ atoms/cm$^3$ and a thickness of 5 to 10 nm. The heavily doped amorphous silicon layer 35 has a phosphorus concentration of $2 \times 10^{20}$ to $6 \times 10^{20}$ atoms/cm$^3$ and a thickness of 60 to 100 nm or more.

These amorphous silicon layers 34 and 35 are allowed to grow on a wafer placed in a reactor by LP-CVD. Silicon crystal nuclei are formed at 530° C. and 25 Pa by supplying monosilane gas at 1,800 to 2,000 ca/min. The deposition pressure is then increased to 90 Pa. In the deposition of amorphous silicon, doping with phosphorus is simultaneously performed by supplying $PH_3$ gas. The flow rate of $PH_3$ gas is first adjusted to 47 to 48 cc/min to form a desired amorphous silicon layer having a low phosphorus concentration ($1\times10^{20}$ atoms/cm$^3$). The flow rate is then adjusted to 180 to 190 cc/min to form a desired amorphous silicon layer having a high phosphorus concentration ($2\times10^{20}$ to $6\times10^{20}$ atoms/cm$^3$).

A WN film and a W gate film are deposited on the amorphous silicon layer 35 as the metal silicide layer 36 by sputtering. A tungsten silicide layer may be formed between the metal film and the amorphous silicon layer 35 to improve the adhesion therebetween. The mask insulating film 37 and a resist are deposited on the metal silicide layer 36, and a gate electrode portion 38 and a wiring portion 39 are formed by photolithography and etching (in FIG. 17). A sidewall insulating film 40 and diffusion layers 41 are formed (in FIG. 18). The amorphous silicon is crystallized by heat treatment in a nitrogen atmosphere at 700° C. to 850° C. to electrically activate the amorphous silicon.

$PH_3$ gas is not supplied in the formation of the crystal nuclei in this embodiment, but may also be supplied in the formation of the crystal nuclei. In addition, the gas used is monosilane gas in this embodiment, but is not limited to monosilane gas and may also be disilane gas.

The gate electrode and wiring thus produced have satisfactorily low contact resistance. According to this embodiment, the lightly doped amorphous silicon layer 34 and the heavily doped amorphous silicon layer 35 are deposited and crystallized by heat treatment. This combination can produce larger crystal grains than a heavily doped amorphous silicon layer alone to provide a wiring structure with lower resistance.

The above embodiments are summarized below. A lightly doped amorphous silicon layer and a heavily doped amorphous silicon layer are deposited after crystal nuclei are formed. This multilayer structure can produce larger crystal grains than the heavily doped amorphous silicon layer alone in the crystallization of the amorphous silicon by heat treatment to provide a polysilicon structure with lower resistance. The lightly doped lower amorphous silicon layer and the heavily doped upper amorphous silicon layer preferably have a difference in impurity concentration of $1\times10^{20}$ atoms/cm$^3$ or more, and the lower amorphous silicon layer preferably has a low impurity concentration. The lightly doped lower amorphous silicon layer preferably has an impurity concentration of $1\times10^{19}$ to $1\times10^{20}$ atoms/cm$^3$ while the heavily doped upper amorphous silicon layer preferably has an impurity concentration of $2\times10^{20}$ to $6\times10^{20}$ atoms/cm$^3$ to attain lower resistance. In the crystal growth by heat treatment, large crystal grains can be formed with the help of the difference between the lower crystal growth rate of the lower amorphous silicon layer and the higher crystal growth rate of the higher amorphous silicon layer. The heat treatment for crystallization is preferably performed at a low temperature in the range of 600° C. to 850° C. If the heat treatment is performed at a high temperature exceeding 850° C. and up to 1,000° C., the treatment is preferably performed in a short time to reduce heat load. The heat treatment is preferably performed in an inert gas atmosphere, more preferably in a nitrogen atmosphere.

According to the present application, a lightly doped amorphous silicon layer and a heavily doped amorphous silicon layer are deposited after crystal nuclei are formed. This multilayer structure can produce larger crystal grains than the heavily doped amorphous silicon layer alone in the crystallization of the amorphous silicon by heat treatment to provide a polysilicon structure with lower resistance. The production methods according to the present application can therefore provide a higher-performance semiconductor integrated circuit with lower power consumption and higher-speed operation by reducing plug wiring resistance.

The present invention has been specifically described above with the embodiments, though the invention is not limited to the embodiments. Naturally, various modifications are permitted within the scope of the present invention.

What is claimed is:

1. A method for producing a semiconductor device, comprising the steps in order of:
    forming isolated silicon crystal nuclei on a substrate;
    depositing first amorphous silicon directly on the isolated silicon crystal nuclei;
    depositing second amorphous silicon directly on the first amorphous silicon; and
    crystallizing the first amorphous silicon and the second amorphous silicon by growing the crystal nuclei in the solid phase.

2. The method for producing a semiconductor device according to claim 1, wherein the solid-phase growth rate of crystals in the second amorphous silicon is adjusted to a higher rate than that of crystals in the first amorphous silicon.

3. The method for producing a semiconductor device according to claim 1, wherein the impurity concentration of the second amorphous silicon is adjusted to a higher concentration than that of the first amorphous silicon.

4. The method for producing a semiconductor device according to claim 3, wherein
    the first amorphous silicon has an impurity concentration of $1\times10^{19}$ to $1\times10^{20}$ atoms/cm$^3$; and
    the second amorphous silicon has an impurity concentration of $2\times10^{20}$ to $6\times10^{20}$ atoms/cm$^3$.

5. The method for producing a semiconductor device according to claim 1, wherein the step of forming the silicon crystal nuclei, the step of depositing the first amorphous silicon, and the step of depositing the second amorphous silicon are continuously performed in the same reaction chamber by low-pressure chemical vapor deposition (LP-CVD).

6. The method for producing a semiconductor device according to claim 5, wherein the step of forming the silicon crystal nuclei is performed by LP-CVD at 520° C. to 540° C. and 25 Pa or less in a gas system mainly containing silane gas or disilane gas.

7. The method for producing a semiconductor device according to claim 5, wherein the step of depositing the first amorphous silicon and the step of depositing the second amorphous silicon are performed by LP-CVD at 520° C. to 540° C. and 90 Pa or more in a gas system mainly containing silane gas or disilane gas.

8. The method for producing a semiconductor device according to claim 1, wherein the first amorphous silicon has a thickness of 3 to 30 nm.

9. The method for producing a semiconductor device according to claim 1, wherein the step of crystallizing the first amorphous silicon and the second amorphous silicon is performed by heat treatment at 600° C. to 850° C.

10. The method for producing a semiconductor device according to claim 9, wherein the heat treatment is performed in a nitrogen atmosphere.

11. The method for producing a semiconductor device according to claim 1, wherein
    the silicon crystal nuclei, the first amorphous silicon, and the second amorphous silicon are deposited on a desired contact region on the substrate;

the first amorphous silicon and the second amorphous silicon are etched to leave a portion thereof on the contact region; and the region other than the contact region is filled with an insulating film.

12. The method for producing a semiconductor device according to claim 1, further comprising the step of depositing third amorphous silicon on the first and second amorphous silicon before the step of crystallizing the first amorphous silicon, the second amorphous silicon, and the third amorphous silicon by allowing the crystal nuclei to grow in the solid phase.

13. The method for producing a semiconductor device according to claim 12, wherein the solid-phase growth rate of crystals in the third amorphous silicon is adjusted to a lower rate than that of crystals in the second amorphous silicon.

14. The method for producing a semiconductor device according to claim 12, wherein the impurity concentration of the third amorphous silicon is adjusted to a lower concentration than that of the second amorphous silicon.

15. The method for producing a semiconductor device according to claim 12, wherein the step of forming the silicon crystal nuclei, the step of depositing the first amorphous silicon, the step of depositing the second amorphous silicon, and the step of depositing the third amorphous silicon are continuously performed in the same reaction chamber by LP-CVD.

16. The method for producing a semiconductor device according to claim 15, wherein the step of forming the third amorphous silicon is performed by LP-CVD at 520° C. to 540° C. and 90 Pa or more in a gas system mainly containing silane gas or disilane gas.

17. A semiconductor device produced by the method according to claim 1.

18. A method for producing a semiconductor device, comprising the steps of:

forming silicon crystal nuclei on a substrate;

depositing first amorphous silicon;

depositing second amorphous silicon; and crystallizing the first amorphous silicon and the second amorphous silicon by growing the crystal nuclei in the solid phase, wherein a contact hole on the substrate is filled with the silicon crystal nuclei, the first amorphous silicon, and the second amorphous silicon to form a contact plug.

19. A semiconductor device produced by the method according to claim 18.

20. A method for producing a semiconductor device, comprising the steps of:

forming silicon crystal nuclei on a substrate;

depositing first amorphous silicon;

depositing second amorphous silicon; and crystallizing the first amorphous silicon and the second amorphous silicon by growing the crystal nuclei in the solid phase, wherein a gate electrode or wiring is formed with the first and second amorphous silicon deposited on the substrate.

* * * * *